United States Patent
Otsuki (10) Patent No.: US 6,180,463 B1
(45) Date of Patent: Jan. 30, 2001

(54) METHOD FOR FABRICATING A MULTI-LEVEL MASK ROM

(75) Inventor: Kazutaka Otsuki, Tokyo (JP)

(73) Assignee: NEC Corporation, Tokyo (JP)

( * ) Notice: Under 35 U.S.C. 154(b), the term of this patent shall be extended for 0 days.

(21) Appl. No.: 09/182,013

(22) Filed: Oct. 29, 1998

(30) Foreign Application Priority Data

Oct. 30, 1997 (JP) .................................................. 9-298925

(51) Int. Cl.⁷ .............................................. H01L 21/8236
(52) U.S. Cl. ........................................... 438/278; 438/276
(58) Field of Search .................................. 438/275, 291, 438/276, 278

(56) References Cited

U.S. PATENT DOCUMENTS

| | | | |
|---|---|---|---|
| 5,712,203 | * | 1/1998 | Hsu ........................................ 438/275 |
| 5,895,241 | * | 4/1999 | Lu et al. ................................ 438/275 |
| 6,004,848 | * | 12/1999 | Shone .................................... 438/278 |
| 6,054,353 | * | 4/2000 | Sheu et al. ............................ 438/275 |

FOREIGN PATENT DOCUMENTS

| | | |
|---|---|---|
| 4-48776 | 2/1992 | (JP) . |
| 5-283653 | 10/1993 | (JP) . |
| 5-299614 | 11/1993 | (JP) . |
| 6-85210 | 3/1994 | (JP) . |
| 7-142611 | 6/1995 | (JP) . |
| 7-142612 | 6/1995 | (JP) . |

* cited by examiner

*Primary Examiner*—Richard Booth
(74) *Attorney, Agent, or Firm*—Sughrue, Mion, Zinn, Macpeak & Seas, PLLC (57) ABSTRACT

A method for fabricating a multi-level mask ROM includes the steps of forming a plurality of memory cell transistors, depositing and planarizing a dielectric film covering the memory cell transistors, forming an opening in the dielectric film in the area for a selected memory cell transistor, and injecting impurity ions through the opening and the gate electrode of the selected memory cell transistor into the channel area thereof to obtain a desired threshold voltage. Planarization of the dielectric film reduces scattering of the injected ions, thereby preventing transverse extension of the injected ions and achieving a higher integration of the multi-level mask ROM.

15 Claims, 6 Drawing Sheets

METHOD FOR FABRICATING A MULTI-LEVEL MASK ROM

BACKGROUND OF THE INVENTION (a) Field of the Invention

The present invention relates to a method for fabricating a multi-level mask ROM (read only memory) and, more particularly, to a method for fabricating a mask ROM having a multi-level ROM cell.

(b) Description of the Related Art

A conventional nonvolatile semiconductor memory device having an insulated gate field effect transistor (IGFET), such as MOSFET, in each memory cell generally stores a 1-bit data, namely "1" or "0". With the demand for increasing the storage capacity in the nonvolatile semiconductor memory device, a multi-level nonvolatile semiconductor memory device is proposed recently which includes a plurality of multi-level memory cells each storing multi-level data, such as 2-bit data.

A method for fabricating a mask ROM, a typical nonvolatile semiconductor memory device, having a multi-level (or 2-bit) memory cell is described in JP-A-7-142611, for example. FIGS. 1A to 1D consecutively show the fabrication process described in the publication, wherein memory cell transistors B1 to B4 have different thresholds Vb1 to Vb4 such that Vb1<Vb2<Vb3<Vb4.

All the memory cell transistors B1 to B4 have a common basic structure including a gate insulating film 102 formed on a semiconductor substrate 101, a gate electrode 103 formed thereon, and source/drain diffused regions 104 in the surface region of the semiconductor substrate 101, with a channel area disposed therebetween below the gate electrode 103. An interlayer dielectric film 105 overlies the entire basic structure.

Figure 1A:
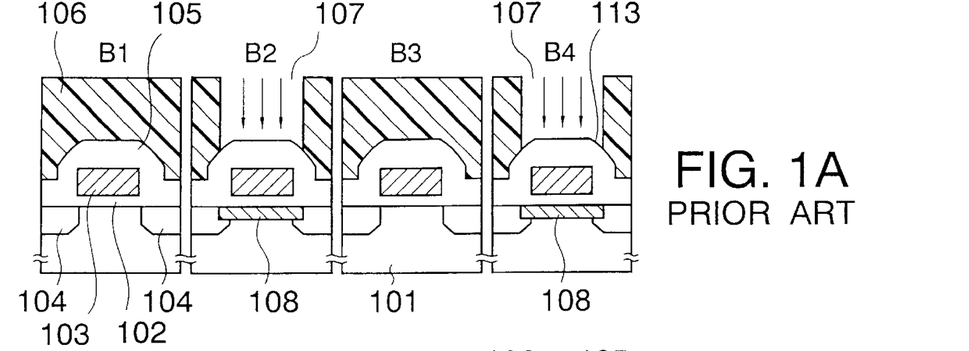
FIGS. 1A to 1D are sectional views of a mask ROM, consecutively showing process steps in a conventional fabrication process thereof.

In FIG. 1A, a first resist mask 106 having first openings 107 exposing the interlayer dielectric film 105 at the memory cell transistors B2 and B4 is formed on the interlayer dielectric film 105 by a photolithographic technique. A first ion-implantation using boron ions is conducted through the first openings 107 and the gate electrode 103 to form first injected regions 108 at the channel areas of the memory cell transistors B2 and B4. The first ion implantation assures the threshold Vb2 for the memory cell transistor B2, by employing a specified dosage with an acceleration energy of about 250 keV.

Figure 1B:
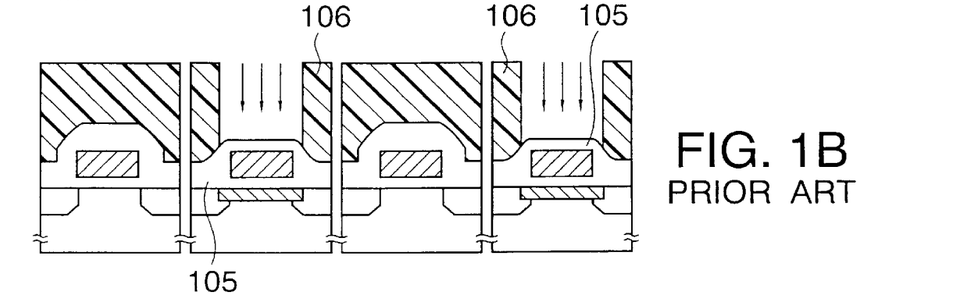

Subsequently, as shown in FIG. 1B, portions of the interlayer dielectric film 105 overlying the memory cell transistors B2 and B4 are selectively etched using the first photoresist mask 106 as an etching mask to reduce the thickness of the portions of the interlayer dielectric film 105, followed by removal of the first photoresist mask 106.

Figure 1C:
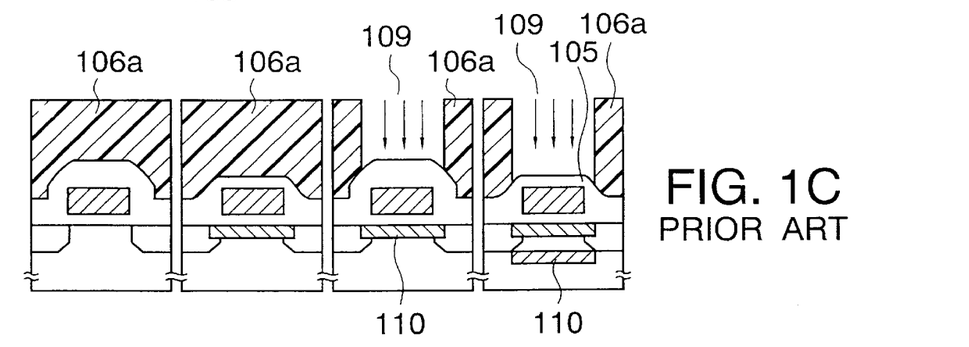

Thereafter, as shown in FIG. 1C, a second photoresist mask 106a is formed having openings 109 for exposing memory cell transistors B3 and B4, followed by a second ion-implantation through the openings 109 and the gate electrodes 103 to form injected regions 110 in the channel areas of the memory cell transistors 13 and B4. In this step, the reduced thickness of the interlayer dielectric film 105 in the memory cell transistor B4 provides a larger depth for the injected region 110 in the memory cell transistor B4 than the channel area in the memory cell transistor B4. The second ion-implantation assures the threshold. Vb3 for the memory cell transistor B3 by employing a specified dosage of the boron ions.

Figure 1D:
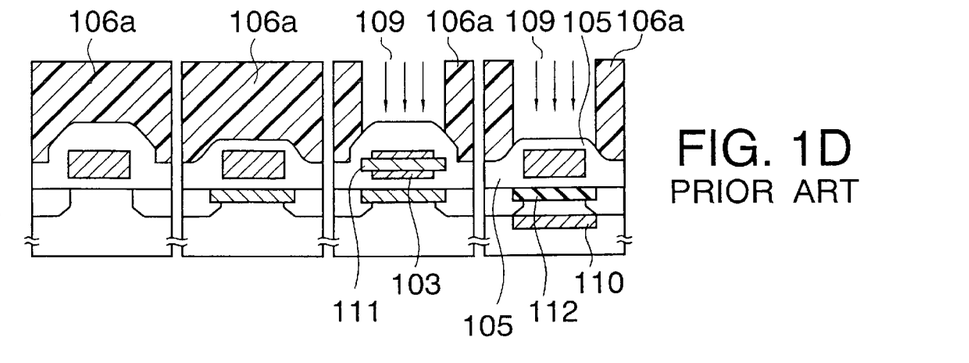

Thereafter, a third ion-implantation is conducted using the is second photoresist mask 106a as it is to form injected regions 112 in the channel area of the memory cell transistor. B4. In this step, an injected region 111 is formed in the gate electrode 103 of the memory cell transistor B3 due to a larger thickness of the interlayer dielectric film 105 than the thickness of the interlayer dielectric film 105 in the memory cell transistor M. Thus, the third ion-implantation does not affect the threshold Vb3 of the memory cell transistor B3 while assuring the, threshold Vb4 of the memory cell transistor B4, which is determined by the second ion-implantation and the third ion-implantation.

In the conventional fabrication method for the multi-level mask ROM as described above, the ion-implantation for specifying the multi-level data in the memory cell transistors (referred to as "code ion-implantation", hereinafter) has a disadvantage in that the injected region formed by the code ion-implantation has a significant extension in the transverse direction with respect to the direction of the ion injection, as detailed below.

Figure 2:
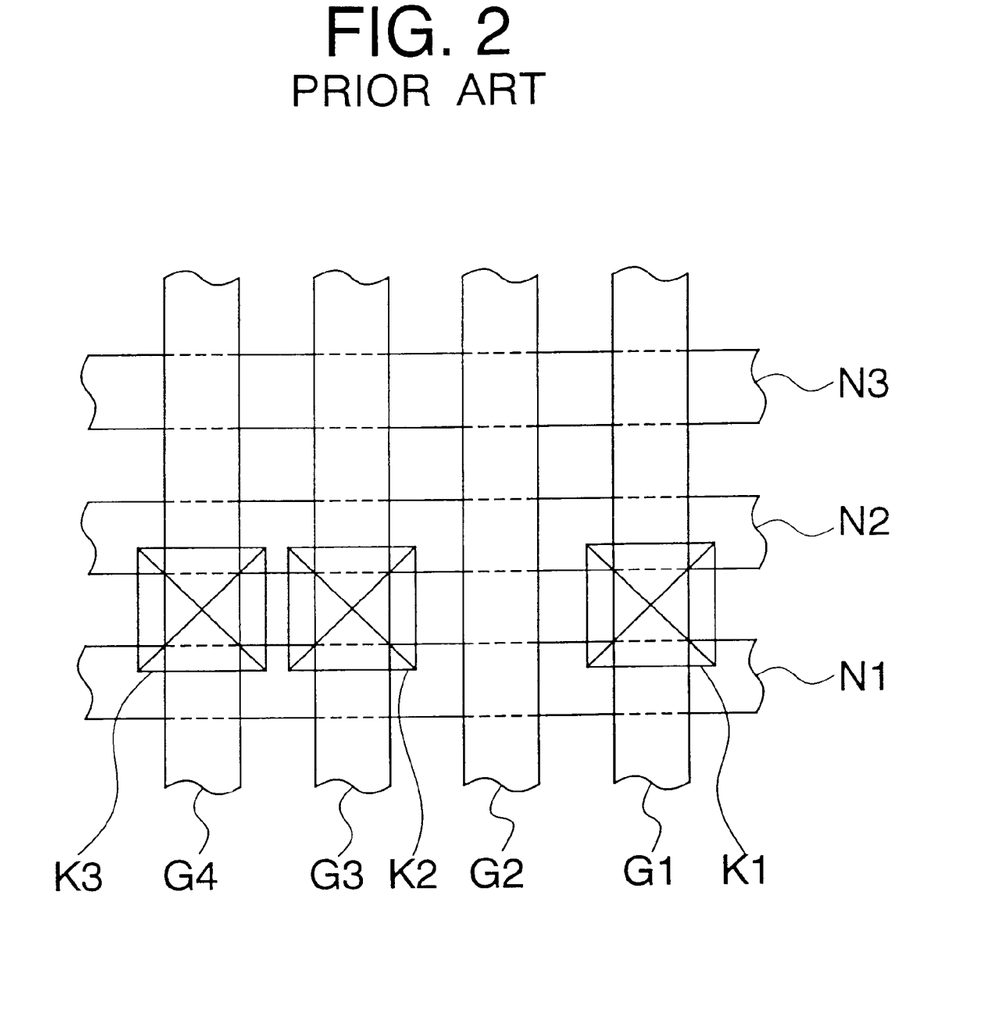
FIG. 2 is a schematic top plan view of the mask ROM of FIGS. 1A to 1D in a step thereof.

FIG. 2 schematically shows an exemplified top plan view showing the openings of the mask ROM in a fabrication step thereof, wherein source/drain diffused regions N1, N2 and N3 extend perpendicularly to the extending direction of the gate electrodes G1, G2 and G3. In this configuration, the channel area of a memory cell transistor is disposed below the gate electrode, such as G1, between the source/drain regions, such as N1 and N2. The code ion-implantation is conducted through the openings K1, K2 and K3 formed in a photoresist mask.

In the ion-implantation, the injected ions are scattered by the surface of the interlayer dielectric film or the gate electrode, especially by the diagonal surface 113 of the interlayer dielectric film 105, when the injected ions pass through the interlayer dielectric film or the gate electrode.

The scattering is one of the factors preventing a higher integration for the memory cell transistors of the multi-level mask ROM because the transverse extension of the injected region in a memory cell transistor affects the threshold of the adjacent memory cell transistors.

SUMMARY OF THE INVENTION

It is an object of the present invention to provide a method for fabricating a multi-level mask ROM, which is capable of suppressing a transverse extension of injected ions during the code ion-implantation of memory cell transistors, thereby reducing variations of the thresholds of the adjacent memory cell transistors.

The present invention provides, in one aspect thereof, a method for fabricating a multi-level mask ROM including a plurality of memory cell transistors, the method comprising the steps of forming a gate insulating film, a gate electrode and source/drain diffused regions in an area for each memory cell transistor of a semiconductor substrate, forming a dielectric film covering the gate electrode and the source/drain regions, planarizing the dielectric film, forming an opening in a portion of the dielectric film overlying the gate electrode in an area for a selected memory cell transistor, and injecting impurity ions through the opening and the gate electrode into a channel area of the selected memory cell transistor to obtain a desired threshold voltage of the selected memory cell transistor.

The present invention also provides, in another aspect thereof, a method for fabricating a multi-level mask ROM including a plurality of memory cell transistors, the method comprising the steps of forming a gate insulating film, a gate electrode and source/drain diffused regions in an area for each memory cell transistor of a semiconductor substrate, forming a first dielectric film covering the gate electrode and the source/drain regions, planarizing the first dielectric film, forming an etch stop layer on the first dielectric film, forming a second dielectric film on the etch stop layer, forming an opening in a portion of the second dielectric film overlying the gate electrode in an area for a selected memory cell transistor, and injecting impurity ions through the opening, etch stop layer and the gate electrode into a channel area of the selected memory cell transistor to obtain a desired threshold voltage of the selected memory cell transistor.

In accordance with the fabrication method of the present invention, the surface of the interlayer dielectric film (first dielectric film) is subjected to planarization to form a flat surface of the interlayer dielectric film, thereby preventing scattering of the implanted ions and reducing a transverse extension of the injected region.

The above and other objects, features and advantages of the present invention will be more apparent from the following description, referring to the accompanying drawings.

PREFERRED EMBODIMENTS OF THE INVENTION

Now, the present invention is more specifically described with reference to accompanying drawings, wherein similar constituent elements are designated by similar reference numerals.

Referring to FIGS. 3A to 3D showing a fabrication process of a 2-bit mask ROM as a method according to a first embodiment of the present invention, memory cell transistors A1 to A4 are designed to have different thresholds Va1 to Va4 such that Va1<Va2<Va3<Va4 for storage of different data of a 2-bit data format.

The memory cell transistors A1 to A4 have a common basic structure including a gate insulating film 12 formed on a p-conductivity type semiconductor substrate 11, a gate electrode 13 formed thereon, and a pair of source/drain diffused regions 14 formed in the surface region of the semiconductor substrate 11 with a channel area disposed therebetween below the gate electrode 13. An interlayer dielectric film 15 formed by a chemical vapor deposition (CVD) technique overlies the entire basic structure of the memory cell transistors. The interlayer dielectric film 15 is subjected to a planarization step using a chemical-mechanical polishing technique after the deposition thereof.

Figure 3A:
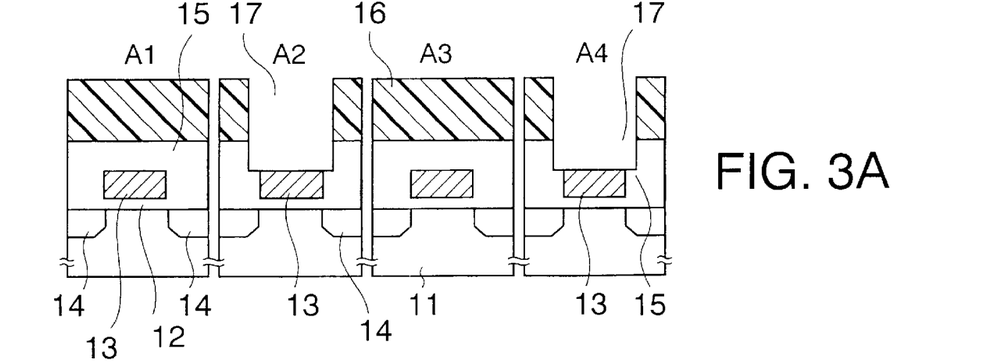
FIGS. 3A to 3D are sectional views of a mask ROM, consecutively showing process steps in a fabrication process of a multi-level nonvolatile semiconductor memory device according to a first embodiment of the present invention.

In FIG. 3A, a first resist mask 16 having first openings 17 exposing portions of the interlayer dielectric film 15 overlying the memory cell transistors A2 and A4 is formed on the interlayer dielectric film 15 by a photolithographic technique. The interlayer dielectric film 15 is selectively etched using the photoresist mask 16 as a mask to expose the surfaces of the gate electrodes 13 of the memory cell transistors A2 and A4.

Figure 3B:
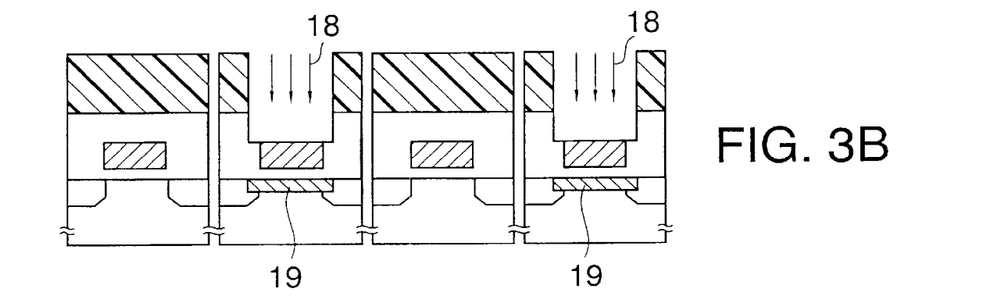

Subsequently, as shown in FIG. 3B, boron ions 18 are injected through the first openings 17 and the gate electrode 13 by a first ion-implantation step to form first injected regions 19 at the channel areas of the memory cell transistors A2 and A4. The first ion implantation assures the threshold (threshold voltage) Va2 for the memory cell transistor A2, by employing a specific dosage of boron ions with an acceleration energy of about 100 keV for the boron ions. The first photoresist mask 16 is then removed.

Figure 3C:
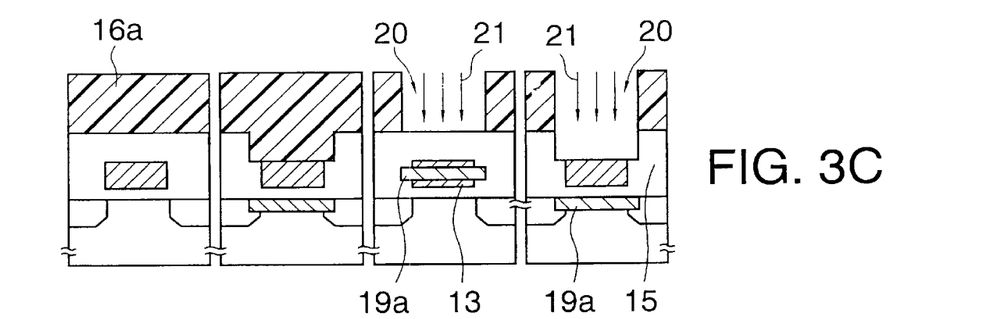

Subsequently, as shown in FIG. 3C, a second photoresist mask 16a is formed having openings 20 for exposing areas for the memory cell transistors A3 and A4, followed by a second ion-implantation for injecting boron-ions 21 through the openings 20 and the gate electrode 13 to add impurity ions to the first injected region 19, thereby forming an adjusted injected region 19a in the channel area of the memory cell transistor A4. In the second ion-implantation step, since the interlayer dielectric 15 has not been etched in the area for the memory cell transistor A3, an adjusted injected region 19a is formed in the gate electrode 13 of the memory cell transistor A3.

Figure 3D:
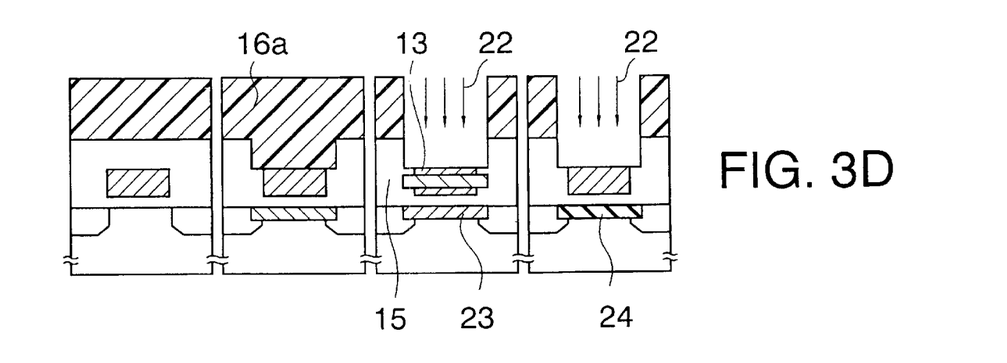

Thereafter, as shown in FIG. 3D, a portion of the interlayer dielectric film 15 overlying the memory cell transistor A3 is etched to expose the gate electrode 13 of the memory cell transistor A3. Then, a third ion-implantation for injecting boron ions 22 is conducted using the second photoresist mask 96a as it is to form injected regions 23 in the channel area of the memory cell transistor A3. In this step, boron ions 22 are introduced also into the adjusted injected region 19a of the memory cell transistor A4 to form a final injected region 24 in the channel area of the memory cell transistor having a threshold of Va4. Thus, the memory cell transistors A1, A2, A3, and A4 have respective thresholds Va1, Va2, Va3 and Va4 such that Va1<Va2<Va3<Va4.

In the fabrication process according to the present embodiment, the effective code ion-implantation for determining the thresholds of the respective memory cell transistors is conducted after the interlayer dielectric film is subjected to the planarization and after portions of the interlayer dielectric films overlying the gate electrodes are removed. Thus, the distance by which the boron ions pass in each ion-implantation is uniform among the first through the third ion-implantation steps. As a result, an equal acceleration energy, if employed, can provide an equal depth for the diff-used regions among the memory cell transistors, which in turn provides feasibility of the control of the variations of depths and transverse extensions of the injected regions.

Figure 4:
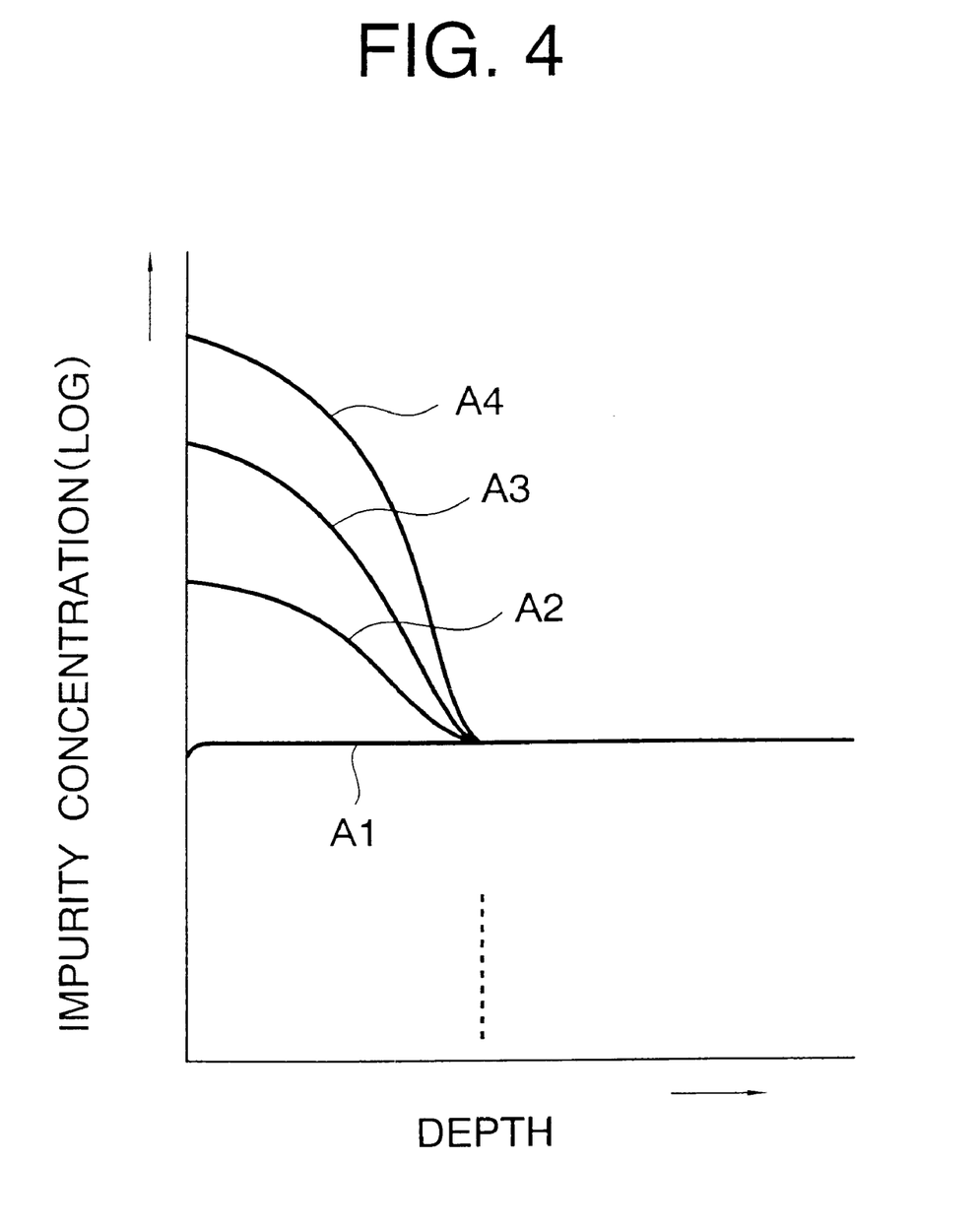
FIG. 4 is an impurity concentration profile of the injected regions in the memory cell transistors plotted against the depth in the mask ROM of FIGS. 3A to 3D.

FIG. 4 shows an impurity concentration profile in the channel areas of the memory cell transistors A1 to A4 plotted in logarithm against the depth in the above embodiment. Memory cell transistor A1 has an impurity concentration in the channel area thereof which is equal to the impurity concentration of the substrate, memory cell transistor A2 has an impurity concentration defined by the first ion-implantation, tile memory cell transistor A3 has an impurity concentration defined by the third ion-implantation, and the memory cell transistor A4 has an impurity concentration defined by the first through the third ion-implantation. In the first through the third ion-implantations, an equal acceleration energy can be used so that the peak of the impurity distribution is controlled to reside at the surface of the channel areas of the memory cell transistors. As a result, the thresholds of the memory cell transistors can be precisely controlled. The peak of the impurity concentration residing at the surface of the channel area provides reduction of the crystal defects caused by the damage from the ion-implantation at the surface of the semiconductor substrate.

In the memory cell transistor A4, which has an injected region formed by the three ion-implantation steps, the total amount of the impurity ions injected therein can be reduced compared to the case of different depths of the ion-implantations to achieve a specified ion concentration. As a result, crystal defects caused by the code ion-implantation can be reduced, which advantage is especially significant in the case of a small TAT (turn around time) mask ROM.

In the process according to the present embodiment, since there is no diagonal surface of the interlayer dielectric film, such as 113 described in connection with the conventional mask ROM, and since the interlayer dielectric film is removed from the surface of the gate electrode, the scattering of the injected ions can be significantly reduced, which reduces a transverse extension of the injected regions.

Referring to FIGS. 5A to 5D showing a fabrication process for a multi-level mask ROM according to a second embodiment of the present invention, the mask ROM has an etch stop layer between the interlayer dielectric films.

Figure 5A:
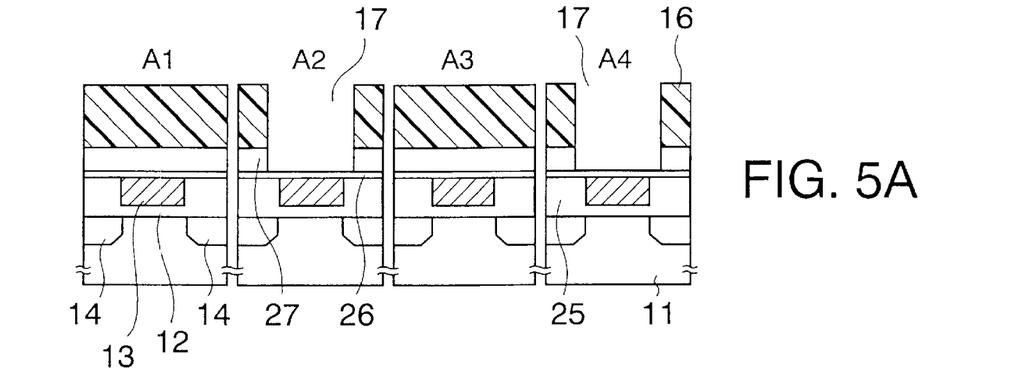
FIGS. 5A to 5D are sectional views of a mask ROM, consecutively showing process steps in a fabrication process of a multi-level semiconductor memory device according to a second embodiment of the present invention.

Specifically, the memory cell transistors A1 to A4, as shown in FIG. 5A, have a common basic structure including a gate insulating film 12 formed on a semiconductor substrate 11, a gate electrode 13 formed thereon, and a source/drain diffused regions 14 formed in the surface region of the semiconductor substrate 11 with a channel area disposed therebetween below the gate electrode 13. A first interlayer dielectric film 25 formed by a chemical vapor deposition (CVD) technique overlies the entire basic structure. The first interlayer dielectric film 25 is subjected to a planarization step using a chemical-mechanical polishing (CMP) technique after the deposition of a silicon oxide film.

In FIG. 5A, an etch stop layer 26 made of silicon oxynitride or silicon nitride is formed on the first interlayer dielectric film 25 by a CVD technique. The etch stop layer 26 has a thickness of about 100 nm, for example. A second interlayer dielectric. film 27 is then deposited on the etch stop layer 26.

A photoresist mask 16 having first openings 17 exposing portions of the second interlayer dielectric film 27 overlying the memory cell transistors A2 and A4 is formed on the second interlayer dielectric film 27 by a photolithographic technique. The portions of the second interlayer dielectric film 27 overlying the memory cell transistors A2 and A4 are selectively removed by a reactive ion etching (RIE) technique using the photoresist mask 16 as a mask, to thereby expose the surface of the etch stop layer 26 in the areas for the memory cell transistors A2 and A4. In the RIE step, a mixture of $C_4H_8$ and CO gases is used wherein the etch stop layer 26 is scarcely etched so that the etching of the first insulator dielectric film can be avoided.

Figure 5B:
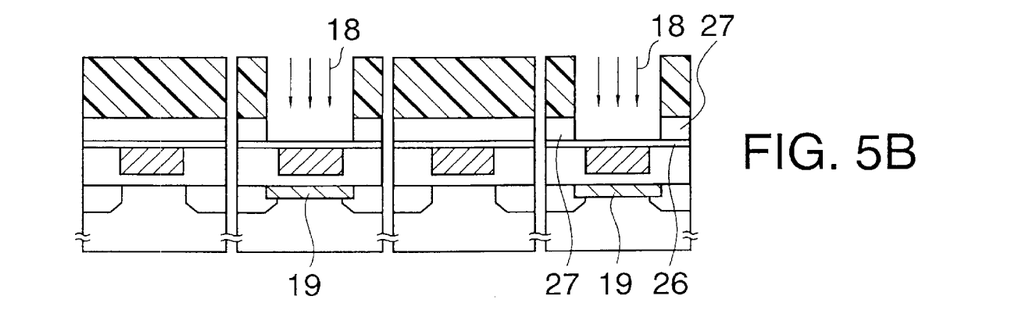

Subsequently, as shown in FIG. 5B, a first ion-implantation is conducted for injecting boron-ions 18 through the openings 17 and the gate electrode 13 to form first injected regions 19 in the channel area of the memory cell transistors A2 and A4. In the first ion-implantation step, the acceleration energy for the boron ions is selected at about 100 keV, with a dosage of the boron ions set at a value to assure the threshold Va2 for the memory cell transistor A2. After the first ion-implantation, the first photoresist film 16 is removed.

Figure 5C:
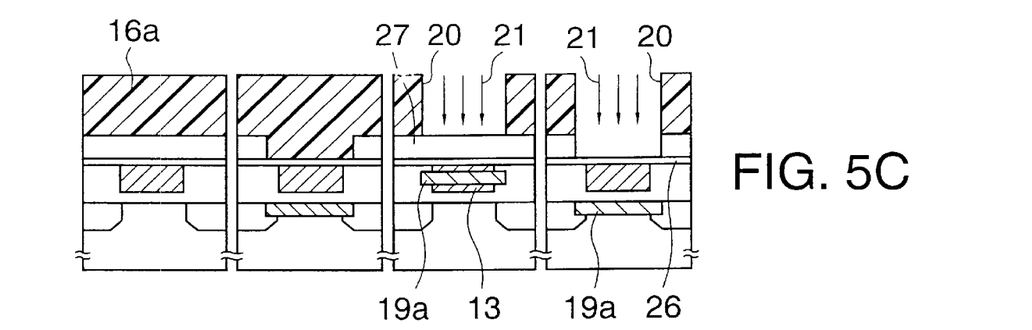

Subsequently, as shown in FIG. 5C, a second photoresist mask 16a is formed having openings 20 for exposing etch stop layer 26 in the area for the memory cell transistor A4 and the second interlayer dielectric film 27 in the area for the memory cell transistor A3. A second ion-implantation for injecting boron-ions 21 is then conducted to add boron ions into the injected region 19 in the memory cell transistor A4 to form all adjusted injected region 19a. In this step, another injected region 19a is also formed in the gate electrode 13 in the memory cell transistor A3 because the second interlayer dielectric film 27 is not etched therein.

Figure 5D:
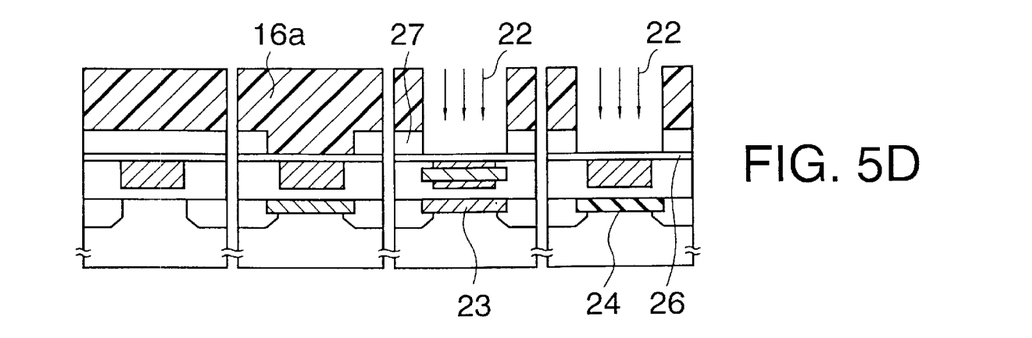

Thereafter, the second interlayer dielectric film 27 is selectively etched using the photoresist mask 16a as a mask by a RIE technique, wherein etch of the first interlayer dielectric film 25 can be avoided due to the etch stop layer 26. Subsequently, a third ion-implantation for injecting boron-ions 22 is conducted to form an injected region 23 in the memory cell transistor A3 and to add impurity concentration in the adjusted injected region 19a to form a final injected region 24 in the memory cell transistor A4.

Thus, the memory cell transistors A1, A2, A3 and A4 have respective thresholds Va1, Va2, Va3 and Va4 so that Va1<Va2<Va3<Va4.

In the second embodiment, in addition to the advantage achieved in the first embodiment, an additional advantage can be obtained wherein openings for a code ion-implantation can be precisely formed with an excellent controllability.

Referring to FIGS. 6A to 6D showing a fabrication process according to a third embodiment of the present invention in a single memory cell transistor, the gate electrode is subjected to a planarization step to further reduce scattering of the injected ions.

Figure 6A:
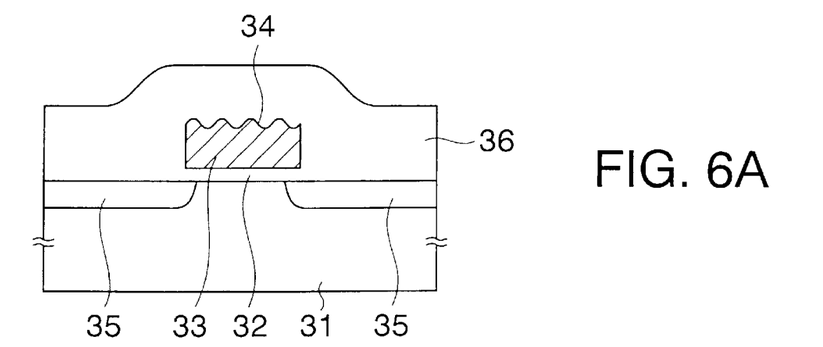
FIGS. 6A to 6D are sectional views of a mask ROM, consecutively showing process steps in a fabrication process of a multi-level semiconductor memory device according to a third embodiment of the present invention.

In FIG. 6A, a gate insulating film 32 is formed on a silicon substrate 31, followed by formation of a gate electrode 33 made of tungsten silicide. The tungsten silicide generally has a polycrystalline structure, which defines surface roughness 34 of about a 20 nm height on the surface of the gate electrode 33.

Figure 6B:
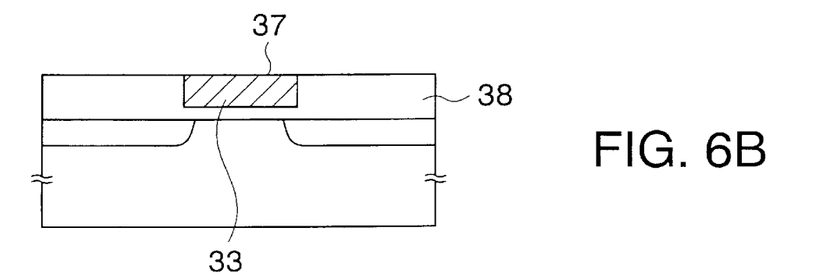

Subsequently, source/drain diffused regions 35 are formed in the surface region of the silicon substrate 31, followed by CVD of a silicon oxide film 36 over the entire surface. The entire surface is then subjected to a CMP process to form a planarized surface 37 of the gate electrode 33, which is flush with a planarized surface of the first interlayer dielectric film 38.

Figure 6C:
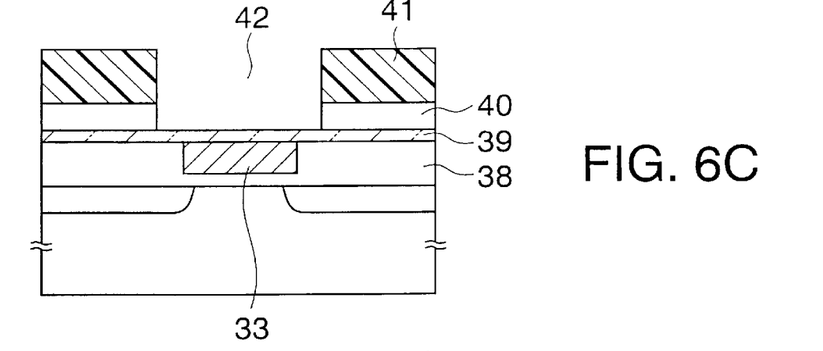

An etch stop layer 39 is then formed on the entire planarized surface, as shown in FIG. 6C, by CVD of silicon nitride.

Figure 6D:
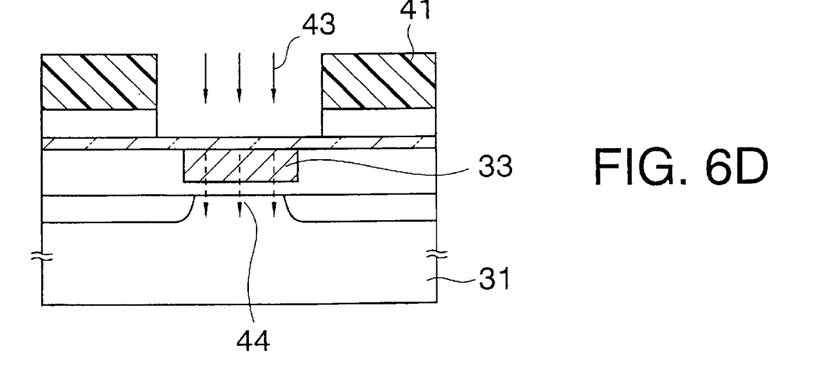

Silicon oxide is then deposited by a CVD process to form a second interlayer dielectric film 40, followed by formation of a photoresist mask 41 having an opening 42 by a RIE process. The RIE process uses a reactive gas which scarcely etches the etch stop layer 39.

A code ion-implantation step using the photoresist mask 41 is conducted to inject boron ions 43 in the direction normal to the surface of the gate electrode 33. The code ion-implantation involves substantially no scattering of boron ions 43 because of the planarized surface of the gate electrode 33. This prevents a transverse extension of the injected region, which in turn provides a further higher integration of the multi-level mask ROM.

Since the above embodiments are described only for examples, the present invention is not limited to the above embodiments and various modifications or alterations can be easily made therefrom by those skilled in the art without departing from the scope of the present invention.

What is claimed is:

1. A method for fabricating a multi-level mask ROM including a plurality of memory cell transistors, said method comprising the steps of forming a gate insulating film, a gate electrode and source/drain diffused regions in an area for each memory cell transistor of a semiconductor substrate, forming a dielectric film covering each said gate electrode and said source/drain regions, planarizing said dielectric film, followed by forming an opening in a portion of said dielectric film overlying said gate electrode in an area for a selected memory cell transistor, and injecting impurity ions through said opening and said gate electrode into a channel area of said selected memory cell transistor to obtain a desired threshold voltage of said selected memory cell transistor.

2. The method as defined in claim 1, wherein said opening exposes therethrough said corresponding gate electrode.

3. The method as defined in claim 1, further comprising the step of planarizing said gate electrode before said dielectric film forming step.

4. The method as defined in claim 1, wherein said impurity ions injecting step is such that impurity ions are injected in a direction substantially normal to a surface of said gate electrode.

5. The method as defined in claim 1, wherein said opening forming step and said impurity ions injecting step are iteratively conducted.

6. The method as defined in claim 1, wherein said planarizing step comprises a chemical-mechanical polishing step.

7. A method for fabricating a multi-level mask ROM including a plurality of memory cell transistors, said method comprising the steps of forming a gate insulating film, a gate electrode and source/drain diffused regions in an area for each memory cell transistor of a semiconductor substrate, forming a first dielectric film covering each said gate electrode and said source/drain regions, planarizing said first dielectric film, forming an etch stop layer on said first dielectric film, forming a second dielectric film on said etch stop layer, forming an opening in a portion of said second dielectric film overlying said gate electrode in an area for a selected memory cell transistor, and injecting impurity ions through said opening, etch stop layer and said gate electrode into a channel area of said selected memory cell transistor to obtain a desired threshold voltage of said selected memory cell transistor.

8. The method as defined in claim 7, wherein said planarizing step exposes a surface of said gate electrode.

9. The method as defined in claim 7, further comprising the step of planarizing said gate electrode before said etch stop layer forming step.

10. The method as defined in claim 7, wherein said impurity ions injecting step is such that impurity ions are injected in a direction substantially normal to a surface of said gate electrode.

11. The method as defined in claim 7, wherein said opening forming step and said impurity ions injecting step are iteratively conducted.

12. The method as defined in claim 7, wherein said planarizing step comprises a chemical-mechanical polishing step.

13. The method as defined in claim 7, wherein said first dielectric film planarizing step exposes said gate electrode.

14. The method as defined in claim 3, wherein said step of planarizing said gate electrode removes a surface roughness of said gate electrode.

15. The method as defined in claim 9, wherein said step of planarizing said gate electrode removes a surface roughness of said gate electrode.

* * * * *

UNITED STATES PATENT AND TRADEMARK OFFICE
CERTIFICATE OF CORRECTION

PATENT NO. : 6,180,463 B1
DATED : January 30, 2001
INVENTOR(S) : Kazutaka Otsuki It is certified that error appears in the above-identified patent and that said Letters Patent is hereby corrected as shown below:

Column 1,
Line 58, delete "13" insert -- B3 --

Column 4,
Line 37, delete "96a" insert -- 16a --;
Line 55, delete "diff-used" insert -- diffused --

Signed and Sealed this

Second Day of April, 2002

JAMES E. ROGAN
Director of the United States Patent and Trademark Office